United States Patent
Dyott

(10) Patent No.: US 6,891,622 B2
(45) Date of Patent: May 10, 2005

(54) CURRENT SENSOR

(75) Inventor: Richard B. Dyott, Oak Lawn, IL (US)

(73) Assignee: KVH Industries, Inc., Middletown, RI (US)

(*) Notice: Subject to any disclaimer, the term of this patent is extended or adjusted under 35 U.S.C. 154(b) by 0 days.

(21) Appl. No.: 09/930,738

(22) Filed: Aug. 15, 2001

(65) Prior Publication Data

US 2002/0027659 A1 Mar. 7, 2002

Related U.S. Application Data

(63) Continuation-in-part of application No. 09/337,231, filed on Jun. 22, 1999.
(60) Provisional application No. 60/119,999, filed on Feb. 11, 1999, provisional application No. 60/120,000, filed on Feb. 11, 1999, provisional application No. 60/133,357, filed on May 10, 1999, and provisional application No. 60/134,154, filed on May 14, 1999.

(51) Int. Cl.[7] .................................. G01B 9/02
(52) U.S. Cl. ...................................... 356/483
(58) Field of Search ................. 356/483, 460, 356/464; 385/12; 250/227.13, 227.18, 227.19, 227.27

(56) References Cited

U.S. PATENT DOCUMENTS

| | | | |
|---|---|---|---|
| 4,564,289 A | * 1/1986 | Spillman, Jr. | ......... 356/33 |
| 4,571,650 A | 2/1986 | Ojima et al. | |
| 4,630,229 A | 12/1986 | D'Hondt | |
| 4,630,890 A | 12/1986 | Ashkin et al. | |
| 4,637,722 A | 1/1987 | Kim | |
| 4,668,264 A | 5/1987 | Dyott | |
| 4,669,814 A | 6/1987 | Dyott | |
| 4,697,876 A | 10/1987 | Dyott | |
| 4,705,399 A | 11/1987 | Graindorge et al. | ......... 356/350 |
| 4,712,866 A | 12/1987 | Dyott | |
| 4,740,085 A | 4/1988 | Lim | |
| 4,755,021 A | 7/1988 | Dyott | |
| 4,756,589 A | 7/1988 | Bricheno et al. | |

(Continued)

FOREIGN PATENT DOCUMENTS

| | | |
|---|---|---|
| DE | 33 05 104 A1 | 8/1984 |
| DE | 36 15 305 A1 | 11/1987 |
| DE | 37 42 201 A1 | 6/1989 |
| EP | 0 551 874 A2 | 7/1993 |
| EP | 0 586 242 A1 | 3/1994 |
| EP | 0 686 867 A1 | 12/1995 |
| EP | 0 722 081 A2 | 7/1996 |
| EP | 856 737 A1 | 8/1998 |
| EP | 0 871 009 A1 | 10/1998 |
| EP | 0 872 756 A1 | 10/1998 |
| JP | 07209398 | 8/1995 |
| WO | WO 98/53352 | 11/1998 |
| WO | WO 00/31551 | 6/2000 |
| WO | WO00/36425 | 6/2000 |

OTHER PUBLICATIONS

US 6,208,775, 3/2001, Dyott (withdrawn)
Ross, J.N., "The Rotation of the Polarization in Low Birefringence Monomode Optical Fibers Due to Geometric Effects," Optical and Quantum Electronics 16 (1984): 455–461.

(Continued)

Primary Examiner—Andrew H. Lee
(74) Attorney, Agent, or Firm—Foley Hoag, LLP

(57) ABSTRACT

A method and device for measuring the current in a conductor are presented. They utilize the Faraday effect on counter-propagating circularly polarized beams of light in a fiber optic coil. The light beams are transformed to and from circular polarization by a polarization transformer comprised of a birefringent fiber with a twist through an appropriate angle at an appropriate distance from one end.

27 Claims, 3 Drawing Sheets

U.S. PATENT DOCUMENTS

| | | | |
|---|---|---|---|
| 4,765,739 A | 8/1988 | Koizumi et al. | |
| 4,776,700 A | 10/1988 | Frigo | |
| 4,796,993 A | 1/1989 | Sonobe et al. | |
| 4,815,817 A | 3/1989 | Levinson | |
| 4,842,409 A | 6/1989 | Arditty et al. | |
| 4,848,910 A | 7/1989 | Dupraz | |
| 4,883,358 A | 11/1989 | Okada | |
| 4,887,900 A | 12/1989 | Hall | |
| 5,033,854 A | 7/1991 | Matthews et al. | |
| 5,048,962 A | 9/1991 | Kurokawa et al. | |
| 5,056,919 A | 10/1991 | Arditty et al. | 356/350 |
| 5,074,665 A | 12/1991 | Huang et al. | |
| 5,080,489 A | 1/1992 | Nishikawa et al. | |
| 5,096,312 A * | 3/1992 | Huang | 385/11 |
| 5,106,193 A | 4/1992 | Fesler et al. | |
| 5,133,600 A | 7/1992 | Schröder | |
| 5,135,555 A | 8/1992 | Coyle, Jr. et al. | |
| 5,136,235 A | 8/1992 | Brandle | 324/96 |
| 5,148,236 A | 9/1992 | Blake et al. | 356/350 |
| 5,289,257 A | 2/1994 | Kurokawa et al. | |
| 5,289,258 A | 2/1994 | Szafraniec et al. | |
| 5,331,404 A | 7/1994 | Moeller et al. | |
| 5,351,123 A | 9/1994 | Spahlinger | |
| 5,359,413 A | 10/1994 | Chang et al. | |
| 5,365,338 A | 11/1994 | Bramson | |
| 5,412,471 A | 5/1995 | Tada et al. | |
| 5,418,881 A | 5/1995 | Hart, Jr. et al. | |
| 5,457,532 A | 10/1995 | August et al. | 356/350 |
| 5,459,575 A | 10/1995 | Malvern | |
| 5,469,257 A | 11/1995 | Blake et al. | |
| 5,469,267 A | 11/1995 | Wang | |
| 5,471,301 A | 11/1995 | Kumagai et al. | |
| 5,475,772 A | 12/1995 | Hung et al. | 385/11 |
| 5,493,396 A | 2/1996 | Sewell | |
| 5,500,909 A | 3/1996 | Meier | |
| 5,504,684 A | 4/1996 | Lau et al. | |
| 5,513,003 A | 4/1996 | Morgan | 356/350 |
| 5,552,887 A | 9/1996 | Dyott | |
| 5,559,908 A | 9/1996 | August et al. | 385/12 |
| 5,644,397 A * | 7/1997 | Blake | 356/483 |
| 5,654,906 A | 8/1997 | Youngquist | |
| 5,655,035 A | 8/1997 | Burmenko | |
| 5,682,241 A | 10/1997 | Mark et al. | |
| 5,696,858 A | 12/1997 | Blake | 385/12 |
| 5,701,177 A | 12/1997 | Kumagai et al. | |
| 5,767,509 A | 6/1998 | Cordova et al. | |
| 5,781,675 A | 7/1998 | Tseng et al. | |
| 5,822,487 A | 10/1998 | Evans et al. | |
| 5,854,864 A | 12/1998 | Knoesen et al. | |
| 5,898,496 A | 4/1999 | Huang et al. | |
| 5,946,097 A | 8/1999 | Sanders et al. | |
| 5,953,121 A * | 9/1999 | Bohnert et al. | 356/483 |
| 5,987,195 A | 11/1999 | Blake | 385/12 |
| 6,023,331 A | 2/2000 | Blake et al. | 356/345 |
| 6,025,915 A | 2/2000 | Michal et al. | |
| 6,047,095 A | 4/2000 | Knoesen et al. | |
| 6,075,915 A | 6/2000 | Koops et al. | |
| 6,148,131 A | 11/2000 | Geertman | |
| 6,163,632 A | 12/2000 | Rickman et al. | |
| 6,185,033 B1 | 2/2001 | Bosc et al. | |
| 6,188,811 B1 | 2/2001 | Blake | 385/12 |
| 6,233,371 B1 | 5/2001 | Kim et al. | |
| 6,301,400 B1 | 10/2001 | Sanders | 385/12 |
| 6,307,632 B1 | 10/2001 | Blake | 356/477 |
| 6,351,310 B1 | 2/2002 | Emge et al. | |
| 6,356,351 B1 | 3/2002 | Blake | 356/483 |
| 6,370,289 B1 | 4/2002 | Bennett | |
| 6,389,185 B1 * | 5/2002 | Meise et al. | 385/11 |
| 6,396,965 B1 | 5/2002 | Anderson | |
| 6,429,939 B1 | 8/2002 | Bennett et al. | |
| 6,434,285 B1 | 8/2002 | Blake et al. | 385/12 |
| 6,519,404 B1 | 2/2003 | Yoshida et al. | |
| 6,535,654 B1 | 3/2003 | Goettsche et al. | 385/11 |
| 6,535,657 B2 | 3/2003 | Dyott | |
| 6,539,134 B1 | 3/2003 | Dyott | |
| 6,542,651 B2 | 4/2003 | Bennett | |
| 6,563,589 B1 | 5/2003 | Bennett et al. | |
| 2002/0018212 A1 | 2/2002 | Bennett et al. | |
| 2002/0025098 A1 | 2/2002 | Dyott | |
| 2002/0180416 A1 | 12/2002 | Dyott | |

OTHER PUBLICATIONS

Alekseev et al; " Fiber Optic Gyroscope With Suppression of Excess Noise From the Radiation Source ", Technical Physical Letters , 24(9): 719–721, (Sep. 1998).

Blake et al., "In–Line Sagnac Interferometer Current Sensor," *IEEE*, pp. 116–121 (1995).

Blake and Szafraniec, "Random Noise in PM and Depolarized Fiber Gyros", OSA Symposium Proceedings, 1997, OWB2, pp. 122–125.

Bohnert. et al., "Field Test of Interferometric Optical Fiber High–Voltage and Current Sensors" *SPIE*, vol. 2360 pp. 16–19 (Feb. 1994).

Bohnert. et al., "Temperature and Vibration Insensitive Fiber–Optic Current Sensor" *ABB*, vol. 2360 pp 336–339 (Feb. 1994).

Burns, et al., "Excess Noise in Fiber Gyroscope Sources", IEEE Photonics Technology Letter, vol. 2, No. 8, Aug. 1990, pp. 606–608.

Clark et al., "Application of a PLL and ALL Noise Reduction Process in Optical Sensing System," *IEEE Translations on Industrial Electronics*, vol. 44, No. 1, Feb. 1997, pp. 136–138.

Dagenais et al., "Low–Frequency Intensity Noise Reduction for Fiber–Optic Sensor Applications," *Optical Fiber Sensors Conference*, 1992, Jan. 29–31, pp. 177–180.

Dupraz, J.P., "Fiber–Optic Interferometers for Current Measurement: Principles and Technology", Alsthom Review No. 9: 29–44 (Dec. 1987).

Frosio, G. and Dändliker, "Reciprocal Reflection Interferometer for a Fiber–Optic Faraday Current Sensor", Applied Optics 33 (25): 6111–6122 (Sep. 1, 1994).

Gronau Yuval et al.; "Digital Signal Processing For An Open–Loop Fiber–Optic Gyroscope", Applied Optics, Optical Society of America, Washington, U.S., vol. 34, No. 25, Sep. 1, 1995, pp. 5849–5853.

Killian M. Kevin; " Pointing Grade Fiber Optic Gyroscope", IEEE AES Systems Magazine, pp. 6–10 (Jul. 1994).

LaViolette and Bossler: "Phase Modulation Control for An Interferometric Fiber Optic Gyroscope", IEEE Plan 90, Position Location and Navigation Symposium, Las Vegas, (Mar. 20–23, 1990).

Lefevre, "The Fiber–Optic Gyroscope", Artech House, Boston, pp. 29–30 (1993).

McCallion and Shimazu; " Side–Polished Fiber Provides Functionality and Transparency", Laser Focus World, 34 (9): S19–S24, (Sep. 1, 1998).

Moeller and Burns, "1.06µm All–fiber Gyroscope with Noise Subtraction, Proceedings of the Conference on Optical Fiber Sensors", IEEE–OSA, Monterey, CA, 1992, pp. 82–85.

Moeller and Burns, "Observation of Thermal Noise in a Dynamically Biased Fiber–Optic Gyro", Optical Letters, 1996, vol. 21, pp. 171–173.

Nikos Drakos, "Circular Polarization States for Light, and Quarter–Wave Plates," *Computer Based Learning Unit*, University of Leeds (Mar. 2, 1998).

One et al.; " A Small–Sized, Compact, Open–loop Fibre–Optic Gyroscope with Stabilized Scale Factor", Meas. Sci. Technol. 1: 1078–1083, (1990.

Polynkin et al.; " All–Optical Noise–Subtraction Scheme for a Fiber–Optic Gyroscope", Optics Letters, 25(3): 147–149, (Feb. 1, 2000).

Rabelo et al.; " SNR Enhancement of Intensity Noise–Limited FOGs", Journal of Lightwave Technology 18(12):2146–2150 (Dec. 2000).

Short, S. et al., "Elimination of Birefringence Induced Scale Factor Errors in the In–Line Sagnac Interferometer Current Sensor", Journal of Lightwave Technology 16 (10): 1844–1850 (Oct. 1998).

* cited by examiner-

CURRENT SENSOR

CROSS-REFERENCE TO RELATED APPLICATIONS

This application is a continuation-in-part of U.S. patent application Ser. No. 09/337,231 filed on Jun. 22, 1999. This application is also based upon and claims priority to the following U.S. patent applications. U.S. provisional patent application, Ser. application No. 60/119,999, filed on Feb. 11, 1999; U.S. provisional patent application, Ser. application No. 60/120,000, filed on Feb. 11, 1999; U.S. provisional patent application, Ser. application No. 60/133,357, filed on May 10, 1999; and U.S. provisional patent application, Ser. application No. 60/134,154, filed on May 14, 1999. This application is also based upon U.S. application Ser. No. 09/337,223, invented by Richard Dyott, which was filed concurrently with U.S. patent application Ser. No. 09/337,231 on Jun. 22, 1999. All of the aforementioned applications are hereby incorporated by reference.

BACKGROUND OF THE INVENTION

1. Field of the Invention

This application relates to the use in current sensors of optical devices that transform light between linearly polarized and elliptically polarized states.

2. Description of Related Art

Devices that transform linearly polarized light to circularly polarized light and the reverse are known in the literature. To make such optical devices, one may use one birefringent fiber with two beams of light of equal frequency and amplitude (or, equivalently, one beam that is the vector sum of these two beams). If the two beams are propagated perpendicular to an optic axis, circularly polarized light may result. Alternatively, linearly polarized light may be transformed to circularly polarized light by using one beam and two fibers.

In practice, constructing a single-beam transformer of linearly to circularly polarized light involves first starting with a length of transforming fiber greater than a predetermined length, and performing several iterations of cutting and measuring polarization until the polarization is deemed to be circular to within some specification. Needless to say, this is a tedious and lengthy procedure requiring lots of guesswork.

SUMMARY OF THE INVENTION

A current sensor is presented including a source of linearly polarized light; two transformers of polarized light as in claim 1 for transforming the linearly polarized light to circularly polarized light; a coil of optical fiber having one or more turns; a directional coupler for optically coupling the linearly polarized light to the transformers; an optical detector for receiving the light beams which have traversed the coil for producing an output signal indicative of a magnetic field produced by an electric current, and a second directional coupler for coupling the light beams to the detector.

A current sensor is presented including a source of linearly polarized light; two transformers of polarized light as described above for transforming the linearly polarized light to circularly polarized light; a coil of optical fiber having one or more turns; a directional coupler for optically coupling the linearly polarized light to the transformers; and an optical detector for receiving the light beams which have traversed the coil for producing an output signal indicative of a magnetic field produced by an electric current, which detector is deployed at a rear facet of the source.

A current sensor is presented including a source of linearly polarized light, a transformer of polarized light as described above for transforming the linearly polarized light to circularly polarized light, a coil of optical fiber having one or more turns, a reflector for reflecting the beam which has traversed the coil, and an optical detector for receiving the light beam which has traversed the coil twice for producing an output signal indicative of a magnetic field produced by an electric current.

A method of detecting the current in a conductor is also presented including generating a linearly polarized light beam, dividing the beam in a directional coupler into two beams, transforming the two beams into circularly polarized light beams using polarization transformers as described above, coupling the two circularly polarized beams into opposite ends of a coil of optical fiber having one or more turns, which coil is disposed around a conductor of electrical current, permitting the beam to pass through the coil in opposite directions, transforming the circularly polarized beams back into linearly polarized beams by means of the polarization transformers, combining the two beams into a combined beam by means of the directional coupler, passing the combined beam through a linear polarizer, and receiving said combined beam with an optical detector for producing an output signal indicative of a magnetic field produced by the electric current in the conductor.

A method of detecting the current in a conductor is also presented including generating a linearly polarized light beam, transforming the linearly polarized light beam into circularly polarized light beams, using a polarization transformer as described above, the transformer arrayed so that the beam emerging contains a component polarized in a clockwise direction and a component polarized in a counterclockwise direction, coupling the beam into an end of a coil of optical fiber having one or more turns, which coil is disposed around a conductor of electrical current, permitting the beam to pass through the coil, reflecting the beam at the end of the coil so that it passes through the coil a second time in the opposite direction, transforming the beam back into a linearly polarized beam by means of the polarization transformer, passing the beam through a linear polarizer, and receiving said beam with an optical detector for producing an output signal indicative of a magnetic field produced by the electric current in the conductor.

DETAILED DESCRIPTION OF THE PREFERRED EMBODIMENT(S)

Figure 1:
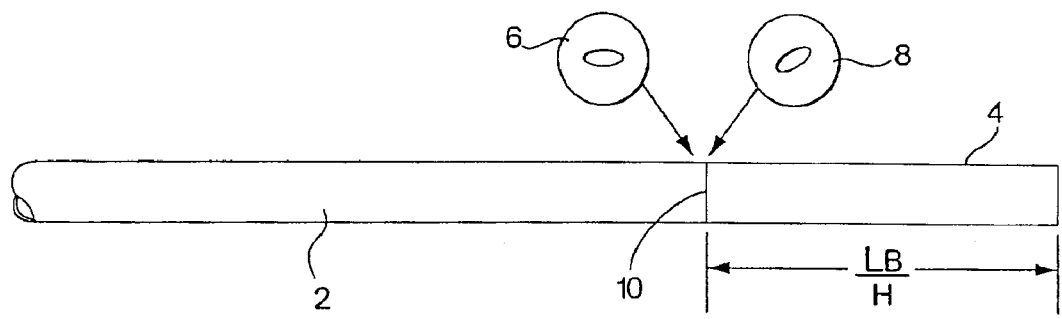
FIG. 1 illustrates the conventional method of fabricating a transformer of linearly to circularly polarized light by splicing two fibers that are properly oriented.

It is often desirable to transform the polarization of a beam of light from one state to another. For this purpose optical devices have been fabricated that input linearly polarized light and output elliptically polarized light. These devices typically function by causing one of two incident linearly polarized light beams to lag behind the other by a pre-selected phase difference. Altering the relative phase of the two incident beams has the effect of changing the state of polarization of the light that exits the optical device. Before considering how these devices of the prior art perform the transformation of linearly to elliptically polarized light and before presenting the detailed description of the preferred embodiment of the present invention, it will be useful to first recall how elliptically polarized light arises.

Two orthogonal electric fields, $E_x$ and $E_y$, both propagating in the z direction can be described by the following two equations $$E_x = i\, E_{0x} \cos(kz-\omega t) \quad (1)$$

and $$E_y = j\, E_{0y} \cos(kz-\omega t+\delta), \quad (2)$$

where i and j are unit vectors in the x and y directions, k is the propagation number, $\omega$ is the angular frequency, and $\delta$ is the relative phase difference between the two modes. The total electric field E is just given by the vector sum $E_x + E_y$. An observer standing at a fixed point on the z-axis and measuring the components $E_x$ and $E_y$ of the total electric field simultaneously would find that these components would fall on the curve $$(E_x/E_{0x})^2 + (E_y/E_{0y})^2 - 2(E_x/E_{0x})(E_y/E_{0y})\cos\delta = \sin^2\delta. \quad (3)$$

Equation (3) is the well known equation of an ellipse making an angle $\alpha$ with the $(E_x, E_y)$-coordinate system, where $$\tan 2\alpha = (2E_{0x}E_{0y} \cos\delta) \div (E_{0x}^2 - E_{0y}^2). \quad (4)$$

Hence, E corresponds to elliptically polarized light. From Equation (3) can be seen that the phase difference $\delta$ dictates some of the characteristics of the ellipse. For example, if $\delta$ were equal to an even multiple of $2\pi$ (i.e., if $E_x$ and $E_y$ are in phase), then Equation (3) reduces to $E_y = (E_{0y}/E_{0x})E_x$, which is the equation of a straight line; in that case, E is linearly polarized. On the other hand, if $\delta$ is equal to $\pm\pi/2$, $\pm 3\pi/2$, $\pm 5\pi/2$, ..., and assuming $E_{0x} = E_{0y} = E_0$, Equation (3) reduces to $E_{0x}^2 + E_{0y}^2 = E_0^2$, which is the equation of a circle. In that case, E is circularly polarized. Of course, linearly and circularly polarized light are just special cases of elliptically polarized light, a line and a circle being special types of ellipses.

From the above considerations, it is clear that if two perpendicular modes of light with equal amplitudes, such as that described by Equations (1) and (2) with $E_{0x} = E_{0y}$, enter an optical device, and proceed to exit the device with a phase shift of $\pi/2$, the result would be circularly polarized light. Typical optical devices that serve to transform linearly polarized light to circularly polarized light work on this principle.

For example, birefringent light fibers are anisotropic meaning that they do not have the same optical properties in all directions. Such fibers have the following properties: If two linearly polarized light beams are traveling along the fiber, or along the z axis, and furthermore one beam is polarized along the y axis and the other along the x axis, then, while the beam polarized along the y axis will travel at a speed v, the other beam that is polarized along the x axis will have a different speed. (In a birefringent fiber, the term "optic axis" may refer to either the fast or the slow axis, which are taken here to be the x and y axes, both perpendicular to the propagation axis, taken here to be the z axis.) Such two beams moving perpendicular to an optic axis may enter the fiber in phase, but because of their disparate speeds will exit with a non-zero phase difference $\delta$. The result, as was seen above, is elliptically polarized light.

In the time, $\Delta t$, that it takes the faster moving beam to traverse the birefringent fiber, the faster moving beam, with speed $v_{fast}$, will outpace the slower moving beam, with speed $v_{slow}$, by a distance $(v_{fast} - v_{slow})\Delta t$. This last mentioned distance contains $(v_{fast} - v_{slow})\Delta t / \lambda_{slow}$ waves of the slower moving beam having wavelength $\lambda_{slow}$. Noting that $\Delta t = L/v_{fast}$, where L is the fiber length, the phase difference between the two beams is given by $$\delta = 2\pi(v_{fast} - v_{slow}) L / (\lambda_{slow}\, v_{fast}). \quad (5)$$

This last equation can be rewritten by substituting $$v_{fast} = \lambda_{fast} \nu, \quad (6)$$

and $$v_{slow} = \lambda_{slow} \nu, \quad (7)$$

where $\nu$ is the common frequency of the slow and fast beams, to yield $$L = (\delta/2\Pi)(1/\lambda_{slow} - 1/\lambda_{fast})^{-1} \quad (8)$$

This last equation makes clear that one can tailor a birefringent fiber to act as a transformer of linearly polarized light into elliptically polarized light simply by choosing the correct length, L, of fiber, although this length depends on the frequency of the light through Equations (7) and (8). The length of fiber that results in a phase difference of $2\Pi$ and that therefore leaves the polarization unchanged is known as a beatlength, denoted by $L_b$, and will play a role in the discussion below.

The above discussion may be generalized to show that if instead of purely monochromatic light, light containing a spectrum of wavelengths is employed, birefringent fibers may be employed to convert such linearly polarized light to elliptically polarized light, where the degree of polarization of the output light decreases with increasing width of the input spectrum. In addition, the above discussion may be generalized to show that the polarization transformer will convert elliptically polarized light into linearly polarized light, if the light propagates through the fiber in the reverse direction.

To make optical devices that transform linearly polarized light into elliptically polarized light, one may use a birefringent fiber with two beams of light of equal frequency and amplitude (or, equivalently, one beam that is the vector sum of these two beams, since, as is known in the art, a single beam of linearly polarized light may be described as the vector sum of two beams, each with a single linear polarization component; conversely, two linearly polarized beams may be vector summed into a single linearly polarized beam). Alternatively, polarization components of unequal amplitude may be employed. As was discussed above, if the two beams are propagated perpendicular to the x axis, and their polarizations are along the x and y axes, elliptically polarized light may result. Alternatively, linearly polarized light may be transformed to circularly polarized light by using one beam and two birefringent fibers, one of which is rotated by 45 degrees with respect to the other about the common propagation axis of the fibers, and of length $L_b/4$.

Referring to FIG. 1, such a single-beam transformer of linearly polarized light to circularly polarized light may be constructed by fusing two silica or glass birefringent fibers.

One of these fibers is the transmitting fiber 2 that delivers light to a second birefringent fiber known as the transforming fiber 4. The transforming fiber 4 is cut to a length of $L_b/4$. In addition, the relative orientation of the two fibers is chosen so that the transmitting fiber 2 is rotated $\Pi/4$ radians with respect to the transforming fiber 4, about the common propagation axis of the two fibers, as indicated by the transmitting fiber cross section 6 and the transforming fiber cross section 8. Such a splicing operation may be done with a commercially available fusion splicer. However, any misalignment of the fibers results in some light being lost at the splice 10. Moreover, as Equation 5 makes clear, errors in the phase difference $\delta$ grow linearly with errors in the fiber length L. In practice, constructing a single-beam transformer of linearly to circularly polarized light involves first starting with a length of transforming fiber 4 greater than $L_b/4$, and performing several iterations of cutting and measuring polarization of light emerging from the end of the transforming fiber until the polarization is deemed to be circular to within some specification. Needless to say, this is a tedious and lengthy procedure requiring lots of guesswork.

Figure 2:
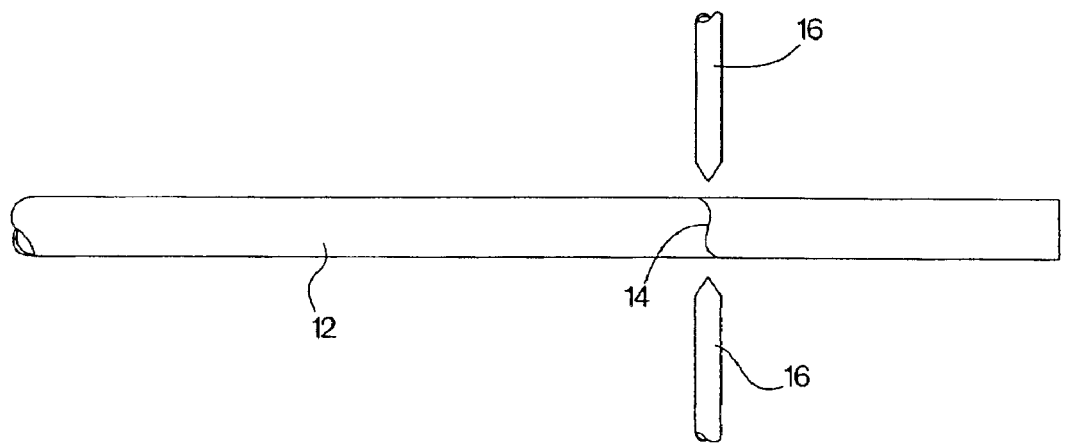
FIG. 2 is a schematic of a twisted fiber that obviates the need to splice fibers together.

The present invention resolves some of the aforementioned problems by presenting an alternate method of fabricating a single-beam transformer of polarized light. Referring to FIG. 2, instead of splicing two fibers offset by $\Pi/4$ radians, in the method of the present invention a single birefringent fiber 12 is twisted about its central axis by this angle. In an alternate embodiment, the fiber may be twisted by an angle of an odd multiple of $\pi/4$ radians. The twist 14 in the fiber may be accomplished by heating the birefringent fiber 12 using arc electrodes 16, or other local heat source known to those of skill in the art. This may be done while applying torsion to twist the fiber, using methods known to those of skill in the art.

Figure 3:
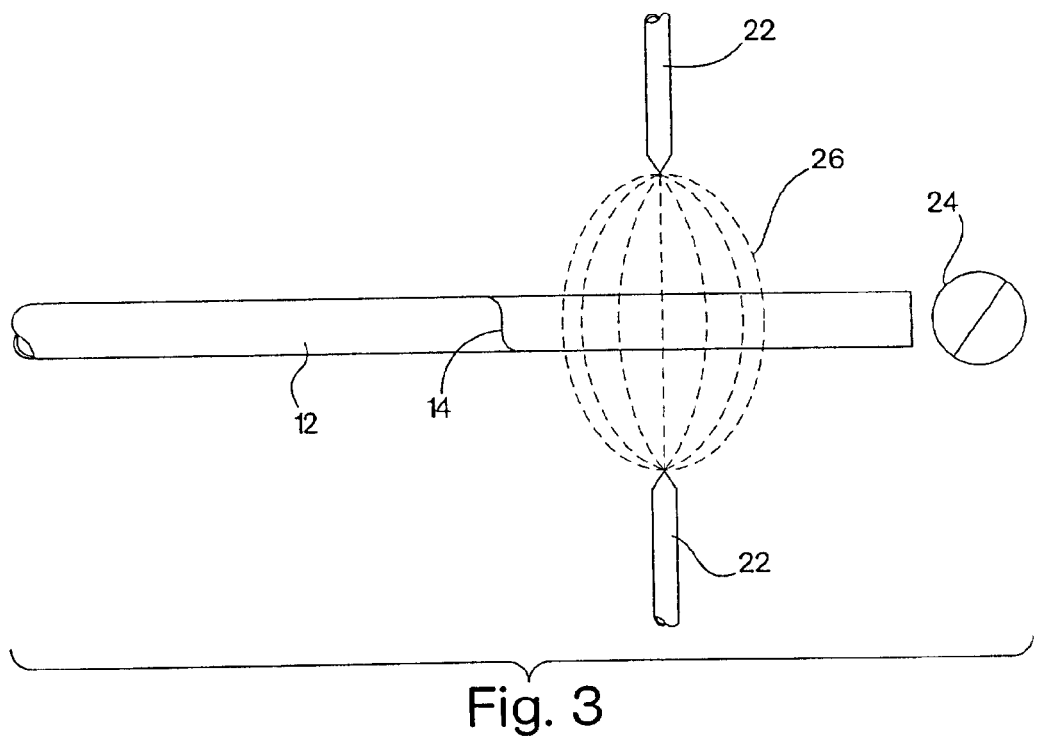
FIG. 3 illustrates how fine tuning of the polarization can be achieved by heating the fiber to cause diffusion of the core into the cladding.

Referring to FIG. 3, in lieu of the tedious iterations of cutting and monitoring, in the method of the present invention, fine tuning is achieved by heating the portion of the fiber beyond the twist with a diffusing arc 26 produced by arc electrodes 22, or other local heat source known to those of skill in the art, to cause diffusion of the fiber core into the cladding. The heating can continue until a polarization monitor 24 indicates that the right polarization state is achieved. The effect of the diffusion is to expand the fields of the fiber modes and so reduce the effective difference $v_{fast}-v_{slow}$, thereby increasing the beat length.

The steps of twisting and diffusing are conceptually independent, and each can be used profitably to make transformers of linearly to elliptically polarized light. Varying the angle through which the birefringent fiber 12 is twisted is tantamount to varying the amplitudes $E_{0x}$ and $E_{0y}$ of Equation (3) and results in different states of elliptically polarized light. The step of diffusing, on the other hand, can be used any time some fine tuning of the polarization is required. For example, after splicing two fibers of appropriate length according to conventional methods, the state of polarization can be fine tuned by causing the core to diffuse into the cladding.

One can also fabricate a transformer using one birefringent fiber and two beams of linearly polarized light. If the two beams are propagated perpendicular to the x axis, and their polarizations are along the x and y axes, elliptically polarized light results. After cutting the single fiber to an appropriate length, fine tuning of the sought-after polarization can be achieved by heating the fiber to cause diffusion of the core into the cladding as mentioned above.

The present invention presents a more convenient method to fabricate a transformer of polarized light. The first step of the method obviates the need to splice a transmitting fiber 2 to a transforming birefringent fiber 4 of length $L_b/4$ with the aim of producing a transformer of linearly to circularly polarized light. Instead, a convenient length of a birefringent fiber 12 is heated to the softening point of the glass and then twisted through an angle of approximately $\pi/4$ radians. In some embodiments, an angle approximately equal to an odd multiple of $\pi/4$ may be employed. The sense of the output polarization (i.e., whether the light is right- or left-circularly polarized) may be determined by the orientation of the input light's polarization vector with respect to the direction of the twist. In a preferred embodiment, the twisting should occur over as short a length as possible. Employing a twist rather than a splice between two fibers offset by an angle keeps optical losses low. What losses do occur may be scarcely measurable in practice.

In the next step of the invention, fine tuning is performed in the following manner. First, the birefringent fiber 12 is cut so that its length from the twist 14 to the end of the fiber is slightly larger than $L_b/4$. In an alternate embodiment, the length of the fiber after the twist may be approximately equal to an odd multiple of $L_b/4$. The twisted birefringent fiber 12 is positioned between the arc electrodes 22 of a fiber fusion splicer. A diffusing arc 26 may be struck at a current lower than that used for splicing in order to raise the temperature of the birefringent fiber 12 to a point below its melting point, but where the fiber core begins to diffuse into the cladding. The effect of the diffusion is to expand the fields of the fiber modes and so reduce the effective birefringence. The light emerging from the transformer is monitored during this operation with the use of a polarization monitor 24, and diffusion is stopped when the light is circularly polarized. FIG. 3 shows the arrangement.

Although what was described above is a preferred method for fabricating a single-beam transformer of linearly to circularly polarized light by the steps of twisting and diffusing, it should be understood that these two steps are independent and each may be profitably used individually. For example, to form a single-beam transformer of linearly to circularly polarized light, a single birefringent fiber can be twisted as described above, and then fine tuned not by the preferred method of diffusing, but by a conventional method of iterations of cutting the fiber to an appropriate length and monitoring the polarization.

Alternatively, two fibers may be spliced together as in usual approaches. The transforming fiber would then be cut to a length of approximately $L_b/4$, or an odd multiple of $L_b/4$. However, unlike the usual methods that then fine tune by iterations of cutting and monitoring, the tuning could proceed by causing the core to diffuse into the cladding, as described above.

Finally, instead of twisting a birefringent fiber through an angle of $\Pi/4$ radians, which corresponds to choosing $E_{0x}=E_{0y}$ in Equation (3), the fiber could be twisted through varying angles. This would be effectively equivalent to varying the amplitudes $E_{0x}$ and $E_{0y}$. As can be seen from this equation, even if the length of the fiber would lead to a phase difference of $\Pi/4$ radians, the result would generally be elliptically polarized light that is non-circular.

The above methods have involved fabricating a single-beam transformer of linearly to circularly, or in the case where the twisting angle is not $\Pi/4$ radians or an odd multiple thereof, elliptically polarized light. As mentioned above, one can also build a transformer using one birefringent fiber and two beams of orthogonally linearly polarized light (of course, two beams of superposed light is equivalent to a single beam equal to the vector sum of the two constituent beams). If the two beams are propagated along the z axis perpendicular to the x axis, and their polarizations are along the x and y axes, elliptically polarized light may result. According to Equations 3, 4, and 5, the type of elliptically polarized light that results depends on the length of the fiber, L. After cutting a birefringent fiber to an appropriate length, fine tuning of the polarization can proceed by diffusing the core into the cladding, as described above.

The transformer of linearly to circularly polarized light described above can be used in a current sensor exploiting the Faraday Effect in a Sagnac interferometer. A main feature of a Sagnac interferometer is a splitting of a beam of light into two beams. By using mirrors or optical fibers, both beams of light are made to traverse at least one loop, but in opposite directions. At the end of the trip around the loop, both beams are recombined thus allowing interference to occur. Any disturbance that affects one or both beams as they are traversing the loop has the potential to alter the interference pattern observed when the beams recombine. Rotating the device is the traditional disturbance associated with Sagnac's name. Another disturbance, giving rise to the Faraday Effect, involves applying an external magnetic field to the medium that forms the loop through which the light travels. Under the influence of such a field, the properties of the light-transmitting medium forming the loop are altered so as to cause a change in the direction of polarization of the light. In turn, this change in the direction of polarization results in a change in the interference pattern observed. These types of disturbances that give rise to a modification in the observed interference pattern are known as non-reciprocal disturbances. They are so-called because, unlike reciprocal effects in which the change produced in one beam cancels with that produced in the other, the changes produced in the two beams reinforce to yield a modification in the resultant interference pattern.

Figure 4:
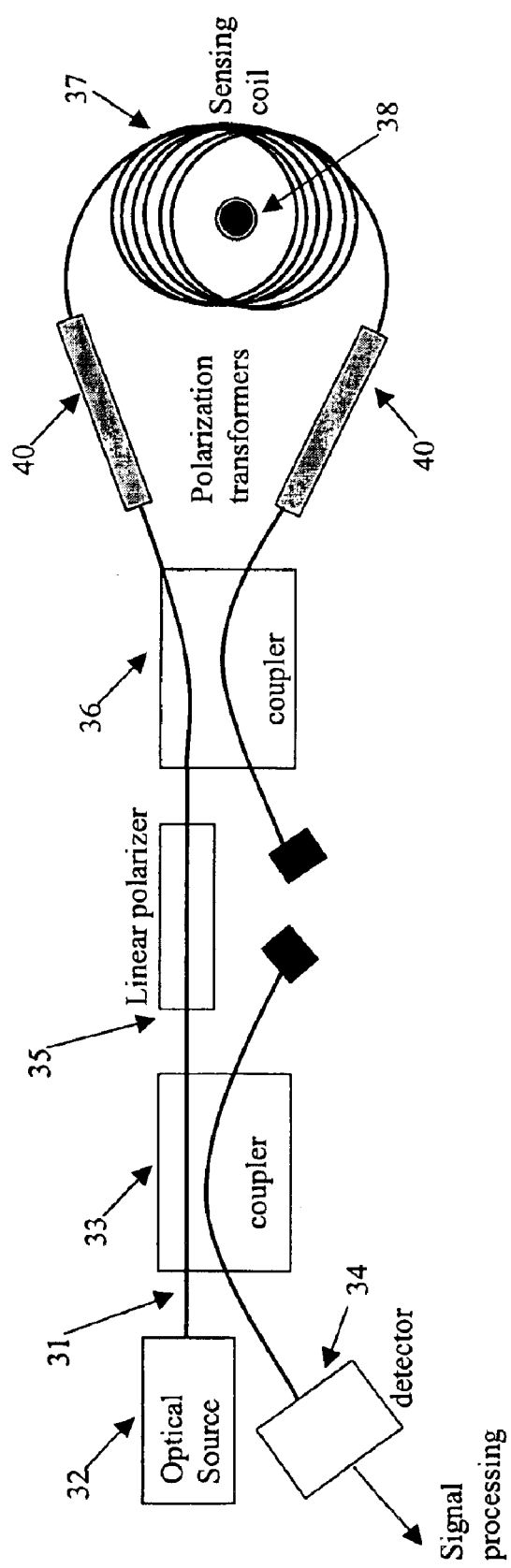
FIG. 4 illustrates a current sensor that includes a polarization transformer.

In FIG. 4 is shown a schematic of a Sagnac interferometer current sensor of the present invention. The light beam 31 emerges from a laser source 32 which is preferably a diode laser oscillating predominantly in a single transverse mode and having a broad and Gaussian-shaped optical spectrum so that back-scatter noise and Kerr-effect problems are reduced. The light beam 31, which may be traveling in a single-mode or polarization maintaining fiber passes through a first directional coupler 33 that isolates the optical detector 34, and then a linear polarizer 35 to ensure a single polarization state. The light beam is then split in two by the second directional coupler 36. In a preferred embodiment, the directional couplers have a 3 dB transfer ratio.

Each of the two output beams of the directional coupler 36 then passes through a polarization transformer 40 which converts the linearly polarized light into circularly polarized light. These polarization transformers may be conventional quarter wave plates, or they may be the twisted fiber polarization transformers described above.

The polarization transformers 40 are oriented such that the two beams have opposite senses of circular polarization. The two beams counterpropagate through a sensing coil 37. The sensing coil may consist of one or more loops of single mode fiber. In a current sensor, a current carrying wire 38 runs approximately through the center of the coil. The magnetic field due to the presence of the current may induce a non-reciprocal phase shift in the counterpropagating light beams which may be detected as described below.

After traversing the sensing coil, each light beam passes through a polarization transformer 40 in the reverse direction, converting the circular polarization back to linear. The two beams may recombine in coupler 36. The combined light traverses linear polarizer 35 and is directed by coupler 33 to a photodetector 34.

The current sensor signal is generated and detected as follows. Due to the Faraday Effect, the presence of the magnetic field alters the sensing coil 37 transmission properties. In particular, the magnetic field causes a phase shift $\alpha$ between the counterpropagating beams (which should not be confused with the phase difference $\delta$ from Equation (2)) corresponding to a rotation of the direction of the electric field. This phase shift results in a change in the interference when both light beams are reunited at the directional coupler 36 before passing through the linear polarizer 35 and to the optical photodetector 34.

As mentioned above, in a preferred embodiment the state of polarization of the light beams entering the sensing coil of polarization maintaining fiber 37, after leaving the transformers 40 of linearly to circularly polarized light, is circular. Correspondingly, the coil's polarization maintaining fiber 37 is circularly cored. However, when the fiber 37 is bent into a coil, stresses occur that give rise to anisotropic effects. For this reason it is advantageous to prepare the fiber 37 for the transmission of light by annealing the fiber 37 while it is in a coil. It is desirable to keep the fiber as symmetrical as possible; in the absence of an external magnetic field, one aims to not change the phase of the transmitted light appreciably over the length of the sensing coil, which is about six meters long. Ideally, the beatlength in the sensing fiber should not be less than six meters; that is, the sensing fiber should have very low birefringence. The transforming fiber, by contrast, is a highly birefringent fiber. Thus one should start with a sensing fiber that is as symmetrical as possible. One may draw the fiber from a pre-form as the pre-form is spun around with the goal of producing a symmetrical fiber. As mentioned above, after the fiber is wound into a coil, annealing can help eliminate any stresses.

The transformer 40 of linearly to circularly polarized light may be that transformer discussed above wherein a birefringent fiber is twisted through $\Pi/4$ radians or an odd multiple thereof after which it is cut at approximately one quarter of a beatlength or an odd multiple thereof. Fine tuning may then proceed as described above with one addition: the end from which the circularly polarized light will emerge is first spliced to the circular cored fiber that is wound into the sensing coil 37. Only then does the fine tuning proceed by heating.

In measuring the phase shift $\alpha$ arising from the Faraday Effect, it is helpful to remember that the measured optical power is proportional to the square of the absolute value of the detected electric field. Ignoring the non-reciprocal power difference, which may be negligible for the typically used coil lengths, the detected power turns out to be proportional to $(1+\cos \alpha)$. This factor presents somewhat of a difficulty when trying to measure the typically small phase shifts $\alpha$. In particular, the rate of change of $1+\cos \alpha$ is asymptotic to $-\alpha$, as $\alpha$ approaches zero, making it difficult to experimentally measure small changes in the phase shift. It therefore becomes necessary to add a biasing phase difference to shift the sensed signal so as to avoid both the maxima and minima of the sinusoid. A phase modulator may perform this function by creating the desired amount of phase difference modulation. The phase modulator may be positioned at one end of the sensing fiber 37. In that embodiment, one of the two counter-propagating light beams receives the phase modulation before it enters the coil, while the other receives it after it exits the coil, while it is traveling in the opposition direction, thereby realizing a non-reciprocal phase difference modulation between the interfering beams. Since the sensed signal becomes biased on a high-frequency carrier, (i.e., the phase modulation signal,) electronic noise may be substantially eliminated while measurement sensitivity may be increased.

There is therefore in place a technique for measuring the current through a conductor: as a consequence of the Biot-Savart Law, an infinitely long conducting wire, for example, carrying a current i, gives rise to a magnetic field whose magnitude at a distance R from the wire is $\mu_0 i \div (2\Pi R)$, where $\mu_0$ is the permeability of free space. If the Sagnac interferometer described above is immersed in this magnetic field, the properties of the fiber 37 that composes the coil will change so as to affect the interference pattern observed. Thus, from the change in this pattern, the current i can be inferred.

Similar current sensors are known in the prior art, e.g., Interferometer device for measurement of magnetic fields and electric current pickup comprising a device of this kind, U.S. Pat. No. 4,560,867, which is incorporated by reference herein. The design of current sensors is similar to that of fiber optic rotation sensors of the type that appears in Fiber Optic Rotation Sensor or Gyroscope with Improved Sensing Coil, U.S. Pat. No. 5,552,887, which is incorporated by reference herein.

It will be understood by those of ordinary skill in the art that the polarization transformer described herein may also be used in current sensors of the "reduced minimum configuration" type, such as that described in published patent application "Reduced Minimum Configuration Fiber Optic Current Sensor," number WO 01/06283, which is incorporated by reference herein. In such a device, the coupler 33 as shown in FIG. 4 is eliminated, and the detector 34 is located at the rear facet of the optical source 32, such that the signal is detected after it has passed through the optical source 32 and emerged from the rear facet of that source.

Similarly, it will be understood by one of ordinary skill in the art that this polarization transformer may also be used in current sensors of the "reflective" type, such as that described in U.S. Pat. No. 5,987,195, which is incorporated by reference herein. In such a device, the coupler 36 is eliminated, there is only a single polarization transformer 40 and after transiting the sensing coil 37 the light beams reach a reflector such as a mirror, wherein they reverse direction, transit the sensing coil a second time, pass through the polarization transformer 40 again and then proceed as described above to be detected. In this device, the linear polarizer 35, the polarization maintaining fiber and the polarization transformer 40 are oriented such that two beams, one circularly polarized in a clockwise sense and one circularly polarized in a counter-clockwise sense emerge into the sensing coil 37.

The aforementioned current sensor has several attractive features. It has no moving parts, resulting in enhanced reliability. There are no cross-axis sensitivities to vibration, acceleration or shock. The current sensor is stable with respect to temperature fluctuations and has a long operational life.

One application of the current sensor is for the measurement of current at high voltages (>0.1MV) in conductors present in voltage transformers. About six meters of polarization maintaining fiber is wound into a multi-turn loop, annealed in situ and then the conductor is threaded through the sensing coil. The current sensor can also be used as a trip-out device that would very quickly detect a short-circuit.

It will be understood by those of ordinary skill in the art, that perfectly linearly or circularly polarized light may be an idealization that can not be realized. I.e., in practice, there may exist uncontrollable factors that give rise to some deviations from perfectly linearly or circularly polarized light. Therefore, it should be understood that when reference is made to linearly or circularly polarized light the meaning of these terms should be taken to mean effectively or approximately linearly or circularly polarized light.

While the invention has been disclosed in connection with the preferred embodiments shown and described in detail, various modifications and improvements thereon will become readily apparent to those skilled in the art. Accordingly, the spirit and scope of the present invention is to be limited only by the following claims.

What is claimed is:

1. A current sensor comprising:
   a) a source of linearly polarized light;
   b) a coil of single-mode optical fiber having a first end, a second end, and one or more turns, the coil being deployed around a conductor which is carrying an electric current to be sensed;
   c) a first transformer of polarized light and a second transformer of polarized light for transforming light between linearly polarized and circularly polarized states, said transformers each comprising a birefringent fiber having a first end, a second end, and a central axis, the birefringent fiber comprising a twist through an angle about the central axis, said twist being at a distance from the first end of the birefringent fiber, the angle and distance chosen so that linearly polarized light entering said second end of the birefringent fiber exits the first end of the birefringent fiber effectively circularly polarized, the first end of said first transformer being coupled to the first end of the coil of single-mode fiber, and the first end of said second transformer being coupled to the second end of the coil;
   d) a first directional coupler for optically coupling the linearly polarized light from the source to the second ends of the transformers;
   e) an optical detector for receiving the light beams which have traversed the coil and producing an output signal indicative of a magnetic field produced by the electric current;
   f) a second directional coupler for optically coupling to the optical detector light which has emerged from the coil, passed through the polarization transformers, and been rejoined by the first directional coupler; wherein the angle is approximately equal to an odd multiple of $\Pi/4$ radians, and the distance is approximately an odd multiple of one quarter of a beatlength.

2. The current sensor of claim 1, wherein the angle is approximately equal to $\Pi/4$ radians.

3. The current sensor of claim 1, wherein the distance is approximately one quarter of a beatlength.

4. The current sensor of claim 3, wherein the angle is approximately equal to $\Pi/4$ radians.

5. A current sensor as in claim 1 wherein the source of linearly polarized light is a diode laser.

6. The current sensor of claim 1, wherein said twist is created by applying a local heat source and applying torsion to the birefringent fiber.

7. The current sensor of claim 1, wherein said birefringent fiber comprises a core diffused into a cladding.

8. A current sensor comprising:
   a) a source of linearly polarized light;
   b) a coil of single-mode optical fiber having a first end, a second end, and one or more turns, the coil being deployed around a conductor which is carrying an electric current to be sensed;

c) a first transformer of polarized light and a second transformer of polarized light for transforming light between linearly polarized and circularly polarized states, said transformers each comprising a birefringent fiber having a first end, a second end, and a central axis, the birefringent fiber comprising a twist through an angle about the central axis, said twist being at a distance from the first end of the birefringent fiber, the angle and distance chosen so that linearly polarized light entering the second end of the birefringent fiber exits the first end of the birefringent fiber circularly polarized, the first end of the first transformer being coupled to the first end of the coil of single-mode fiber, and the first end of the second transformer being coupled to the second end of the coil;

d) a first directional coupler for optically coupling the linearly polarized light from the source to the second ends of the transformers; and e) an optical detector for receiving light which has traversed the coil and producing an output signal indicative of a magnetic field produced by the electric current, wherein the optical detector is deployed at a rear facet of the source; wherein the angle is approximately equal to an odd multiple of Π/4 radians, and the distance is approximately an odd multiple of one quarter of a beatlength.

9. The current sensor of claim 8, wherein the angle is approximately equal to Π/4 radians.

10. The current sensor of claim 8, wherein the distance is approximately one quarter of a beatlength.

11. The current sensor of claim 10, wherein the angle is approximately equal to Π/4 radians.

12. A current sensor as in claim 8 wherein the source of linearly polarized light is a diode laser.

13. A current sensor comprising:

a) a source of linearly polarized light;

b) a coil of single-mode optical fiber having a first end, a second end, and one or more turns, the coil being deployed around a conductor which is carrying an electric current to be sensed;

c) a transformer of polarized light for transforming light between linearly polarized and circularly polarized states, said transformer comprising a birefringent fiber having a first end, a second end, and a central axis, the birefringent fiber comprising a twist through an angle about the central axis, said twist being at a distance from the first end of the birefringent fiber, the angle and distance chosen so that linearly polarized light entering the second end of the birefringent fiber exits the first end of the birefringent fiber circulary polarized, the first end of the first transformer being coupled to the first end of the coil of single-mode fiber, and the first end of the second transformer being coupled to the second end of the coil;

d) a reflector connected to the second end of the coil; and e) an optical detector for receiving light which has traversed the coil and producing an output signal indicative of a magnetic field produced by the electric current; wherein the angle is approximately equal to an odd multiple of Π/4 radians, and the distance is approximately an odd multiple of one quarter of a beatlength.

14. The current sensor of claim 13, wherein the angle is approximately equal to Π/4 radians.

15. The current sensor of claim 13, wherein the distance is approximately one quarter of a beatlength.

16. The current sensor of claim 15, wherein the angle is approximately equal to Π/4 radians.

17. A current sensor as in claim 13 wherein the source of linearly polarized light is a diode laser.

18. A method of detecting a current in a conductor comprising:

a) generating a linearly polarized light beam;

b) dividing the linearly polarized light beam into a first beam and a second beam, using a directional coupler, the first beam buying a polarazation and the second beam having a polarization, the polarization of the first beam and the polarization of the second beam being linear;

c) transforming the polarization of the first beam from effectively linear to effectively circular using a first transformer of polarized light, and transforming the polarization of the second beam from effectively linear to effectively circular using a second transformer of polarized light, said transformers each comprising a birefringent fiber having a first end, a second end, and a central axis, the birefriengent fiber comprising a twist through an angle about the central axis, said twist being at a distance from the first end of the birefringent fiber, the angle and distance chosen so that a linearly polarized light beam entering the second end of the birefringent fiber exits the first end of the birefringent fiber effectively circulary polarized, the transformers oriented so that when the polarization of the first beam is transformed to effectively circular polarization in a clockwise direction, the polarization of the second beam transformed to effectively circular polarization in a counter-clockwise direction;

d) coupling the first beam into a first end of a coil of single-mode optical fiber, and coupling the second beam into a second end of the coil, the coil having one or more turns, coil disposed around a conductor of electric current;

e) permitting the beams to pass through the coil in opposite directions;

f) transforming the polarization of the first beam from effectively circular to effectively linear, and transforming the polarization of the second beam from effectively circular to effectively linear, by means of the polarization transformers;

g) combining the first beam and the second beam into a combined beam by means of the directional coupler;

h) passing the combined beam through a linear polarizer;

i) receiving said combined beam with an optical detector for producing an output signal indicative of a magnetic field produced by the electric in the conductor, wherein the angle is approximately equal to an odd multiple of Π/4 radians, and the distance is approximately an odd multiple of one quarter of a beatlength.

19. The method of claim 18, wherein the angle is approximately equal to Π/4 radians.

20. The method of claim 18, wherein the distance is approximately one quarter of a beatlength.

21. The current sensor of claim 20, wherein the angle is approximately equal to Π/4 radians.

22. The method of claim 18 wherein the source of linearly polarized light is a diode laser.

23. A method of detecting a current in a conductor comprising;

a) generating a linearly polarized light beam;

b) transforming the polarization of the light beam from linear to circular using a polarization transformer, said transformer including a birefringent fiber having a first end, a second end, and a central axis, the birefringent fiber comprising a twist through an angle about the central axis, said twist being at a distance from the first end of the birefringent fiber, the angle and distance chosen so that an effectively linearly polarized light beam entering the second end of the birefringent fiber exits the first end of the birefringent fiber circulary polarized;

c) coupling the beam into a first end of a coil of single-mode optical fiber having one or more turns, and being disposed around a conductor of electric current;

d) permitting the beam to pass through the coil;

e) reflecting the beam at a second end of the coil so that it passes through the coil a second time in the opposite direction;

f) transforming the beam back into a linearly polarized beam polarization of the light beam from effectively circular to effectively linear, by means of the polarization transformer;

g) passing the beam through a linear polarizer; and h) receiving said beam with an optical detector for producing an output signal indicative of a magnetic field produced by the electric in the conductor, wherein the angle is approximately equal to an odd multiple of $\Pi/4$ radians, and the distance is approximately an odd multiple of one quarter of a beatlength.

24. The method of claim 23, wherein the angle is approximately equal to $\Pi/4$ radians.

25. The method of claim 23, wherein the distance is approximately one quarter of a beatlength.

26. The current sensor of claim 25, wherein the angle is approximately equal to $\Pi/4$ radians.

27. The method of claim 23 wherein the source of linearly polarized light is a diode laser.

* * * * *